(12) United States Patent
Hara

(10) Patent No.: US 12,212,225 B2
(45) Date of Patent: Jan. 28, 2025

(54) SEMICONDUCTOR DEVICE

(71) Applicant: ROHM CO., LTD., Kyoto (JP)

(72) Inventor: Hideo Hara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 263 days.

(21) Appl. No.: 17/782,896

(22) PCT Filed: Aug. 26, 2020

(86) PCT No.: PCT/JP2020/032150
§ 371 (c)(1),
(2) Date: Jun. 6, 2022

(87) PCT Pub. No.: WO2021/131157
PCT Pub. Date: Jul. 1, 2021

(65) Prior Publication Data
US 2023/0011729 A1    Jan. 12, 2023

(30) Foreign Application Priority Data

Dec. 27, 2019    (JP) ................................. 2019-239428

(51) Int. Cl.
*H02M 1/08*    (2006.01)
*H02M 1/00*    (2006.01)
*H02M 1/38*    (2007.01)

(52) U.S. Cl.
CPC ........... *H02M 1/08* (2013.01); *H02M 1/0006* (2021.05); *H02M 1/38* (2013.01)

(58) Field of Classification Search
CPC ...... H02M 1/08; H02M 1/084; H02M 1/0845; H02M 1/088; H02M 1/092; H02M 1/0006;

(Continued)

(56) References Cited

U.S. PATENT DOCUMENTS

2008/0174292 A1* 7/2008 Nishida ................. H02M 3/156
323/284
2011/0187439 A1    8/2011 Sugie
(Continued)

FOREIGN PATENT DOCUMENTS

| JP | 2011-055470 | 3/2011 |
| JP | 2014-090006 | 5/2014 |
| WO | 2018/003827 | 3/2019 |

OTHER PUBLICATIONS

International Search Report issued in International Application No. PCT/JP2020/032150, Nov. 2, 2020, 5 pages w/translation.

*Primary Examiner* — Alex Torres-Rivera
(74) *Attorney, Agent, or Firm* — HSML P.C.

(57) ABSTRACT

A semiconductor device includes high-side and low-side switching elements connected in series to form a switching arm, a high-side driver IC for driving the high-side switching element, and, on a chip separate from the high-side switching element, a low-side driver IC for driving the low-side switching element. The driver IC includes a first controller for monitoring a switching voltage appearing at the node where the high-side and low-side switching elements are connected together. When a first driving control signal fed in from outside the semiconductor device instructs to turn on the high-side switching element, the first controller determines whether or not to permit the high-side switching element to be turned on based on a result of checking the switching voltage.

3 Claims, 11 Drawing Sheets

(58) Field of Classification Search
CPC ...... H02M 1/38; H02M 3/158; H02M 1/0029; H02M 3/156
See application file for complete search history.

(56) References Cited

U.S. PATENT DOCUMENTS

| | | | |
|---|---|---|---|
| 2012/0212863 A1* | 8/2012 | Ando | H02H 7/222 |
| | | | 361/45 |
| 2013/0141154 A1 | 6/2013 | Sugie | |
| 2014/0191744 A1* | 7/2014 | Choi | H02M 3/158 |
| | | | 323/283 |
| 2019/0305689 A1 | 10/2019 | Ando | |
| 2020/0153427 A1* | 5/2020 | Bagheri | H03K 7/08 |
| 2021/0028716 A1 | 1/2021 | Ando | |

* cited by examiner

SEMICONDUCTOR DEVICE

TECHNICAL FIELD

The present invention relates to a semiconductor device.

BACKGROUND ART

Recent years have seen the emergence of IPMs (intelligent power modules) that have accommodated in a single package a power device, such as an IGBT (insulated gate bipolar transistor) or a MOSFET (metal-oxide-semiconductor field-effect transistor), along with a driver IC for driving the power device.

Some IPMs include, as power devices, a high-side switching element (an upper arm switching element) and a low-side switching element (a lower arm switching element) which are connected in series. Such IPMs can be configured to have two separate driver IC chips, one for the high-side driver IC that drives the control terminal of the high-side switching elements and the other for the low-side driver IC that drives the control terminal of the low-side switching elements (for one example of such IPMs, see Patent Document 1).

LIST OF CITATIONS

Patent Literature

[Patent Document 1] WO/2018/003827

SUMMARY OF THE INVENTION

Problem to be Solved by the Invention

The high-side and low-side switching elements are turned on and off complementarily such that one is on when the other is off. Here, to prevent a high current from passing across the high-side and low-side switching elements due to both of them being on, a dead time is provided during which the high-side and low-side switching elements are both off simultaneously.

Conventionally, in an IPM including two driver ICs like the one mentioned above, a dead time is provided using a driving control signal that is output from a microprocessor outside the IPM to be fed to the IPM, and simultaneous-on prevention of the high-side and low-side switching elements depends on, not control within the IPM, but that by the microprocessor.

However, there is a risk that, due to uncertain factors, the driving control signal output from the microprocessor may behave as a driving control signal that keeps on the high-side and low-side switching elements simultaneously, possibly leading to a high current passing across the high-side and low-side switching elements.

Against the background described above, the present invention is aimed at providing a semiconductor device which makes it possible to prevent a high-side and a low-side switching element from being on simultaneously.

Means for Solving the Problem

According to a first aspect of the present invention, a semiconductor device includes a high-side switching element and a low-side switching element connected in series between an input voltage and a ground potential to form a switching arm, a high-side driver IC configured to drive the high-side switching element, and a low-side driver IC configured to drive the low-side switching element and configured as a chip separate from the high-side driver IC. The high-side driver IC includes a first controller configured to monitor a switching voltage appearing at the node at which the high-side and low-side switching elements are connected together, and, when a first driving control signal fed in from outside the semiconductor device instructs to turn on the high-side switching element, the first controller determines whether or not to permit the high-side switching element to be turned on based on the result of checking the switching voltage (a first configuration).

In the semiconductor device according to the first configuration described above, the low-side driver IC may include a second controller configured to monitor the switching voltage, and, when a second driving control signal fed in from outside the semiconductor device instructs to turn on the low-side switching element, the second controller may determine whether or not to permit the low-side switching element to be turned on based on the result of checking the switching voltage (a second configuration).

The semiconductor device according to the first configuration described above may further include a first terminal connectable to one terminal of a boot capacitor, a second terminal which is connected to the node and is connectable to another terminal of the boot capacitor, a third terminal configured to be capable of being fed with a supply voltage, and a boot diode having its cathode electrically connected to the first terminal and its anode electrically connected to the third terminal. The low-side driver IC may include a second controller configured to monitor a boot voltage appearing at the first terminal, and, when a second driving control signal fed in from outside the semiconductor device instructs to turn on the low-side switching element, the second controller may determine whether or not to permit the low-side switching element to be turned on based on the result of checking the boot voltage (a third configuration).

In the semiconductor device according to the first configuration described above, the low-side driver IC may include a second controller configured to be communicable with the first controller, and, when a second driving control signal fed in from outside the semiconductor device instructs to turn on the low-side switching element, the second controller may be notified by the first controller whether the high-side switching element is on or off to determine whether or not to permit the low-side switching element to be turned on (a fourth configuration).

According to a second aspect of the present invention, a semiconductor device includes a high-side switching element and a low-side switching element connected in series between an input voltage and a ground potential to form a switching arm, a high-side driver IC configured to drive the high-side switching element, a low-side driver IC configured to drive the low-side switching element and configured as a chip separate from the high-side driver IC, a first terminal connectable to one terminal of a boot capacitor, a second terminal which is connected to the node at which the high-side and low-side switching elements are connected together and is connectable to another terminal of the boot capacitor, a third terminal configured to be capable of being fed with a supply voltage, and a boot diode having its cathode electrically connected to the first terminal and its anode electrically connected to the third terminal. The high-side driver IC includes a first controller configured to monitor a boot voltage appearing at the first terminal, and, when a first driving control signal fed in from outside the semiconductor device instructs to turn on the high-side switching element, the first controller determines whether or not to permit the high-side switching element to be turned on based on the result of checking the boot voltage (a fifth configuration).

In the semiconductor device according the fifth configuration described above, the low-side driver IC may include a second controller configured to monitor a switching voltage appearing at the node, and, when a second driving control signal fed in from outside the semiconductor device instructs to turn on the low-side switching element, the second controller may determine whether or not to permit the low-side switching element to be turned on based on the result of checking the switching voltage (a sixth configuration).

In the semiconductor device according the fifth configuration described above, the low-side driver IC may include a second controller configured to monitor the boot voltage, and, when a second driving control signal fed in from outside the semiconductor device instructs to turn on the low-side switching element, the second controller may determine whether or not to permit the low-side switching element to be turned on based on the result of checking the boot voltage (a seventh configuration).

In the semiconductor device according the fifth configuration described above, the low-side driver IC may include a second controller configured to be communicable with the first controller, and, when a second driving control signal fed in from outside the semiconductor device instructs to turn on the low-side switching element, the second controller may be notified by the first controller whether the high-side switching element is on or off to determine whether or not to permit the low-side switching element to be turned on (an eighth configuration).

According to a third aspect of the present invention, a semiconductor device may include a high-side switching element and a low-side switching element connected in series between an input voltage and a ground potential to form a switching arm, a high-side driver IC configured to drive the high-side switching element, and a low-side driver IC configured to drive the low-side switching element and configured as a chip separate from the high-side driver IC. The high-side driver IC may include a first controller. The low-side driver IC may include a second controller configured to be communicable with the first controller. When a first driving control signal fed in from outside the semiconductor device instructs to turn on the high-side switching element, the first controller may be notified by the second controller whether the low-side switching element is on or off to determine whether or not to permit the high-side switching element to be turned on. When a second driving control signal fed in from outside the semiconductor device instructs to turn on the low-side switching element, the second controller may be notified by the first controller whether the high-side switching element is on or off to determine whether or not to permit the low-side switching element to be turned on (a ninth configuration).

The semiconductor device according to any of the first to ninth configurations described above may include three switching arms including the switching arm. The high-side driver IC may drive three high-side switching elements in the three switching arms, and the low-side driver IC may drive three low-side switching elements in the three switching arms (a tenth configuration).

Advantageous Effects of the Invention

With a semiconductor device according to the present invention, it is possible to prevent a high-side and a low-side switching element from being on simultaneously.

DESCRIPTION OF EMBODIMENTS

Exemplary embodiments of the present invention will be described below with reference to the accompanying drawings.

First Embodiment

<<Configuration of an IPM System>>

Figure 1:
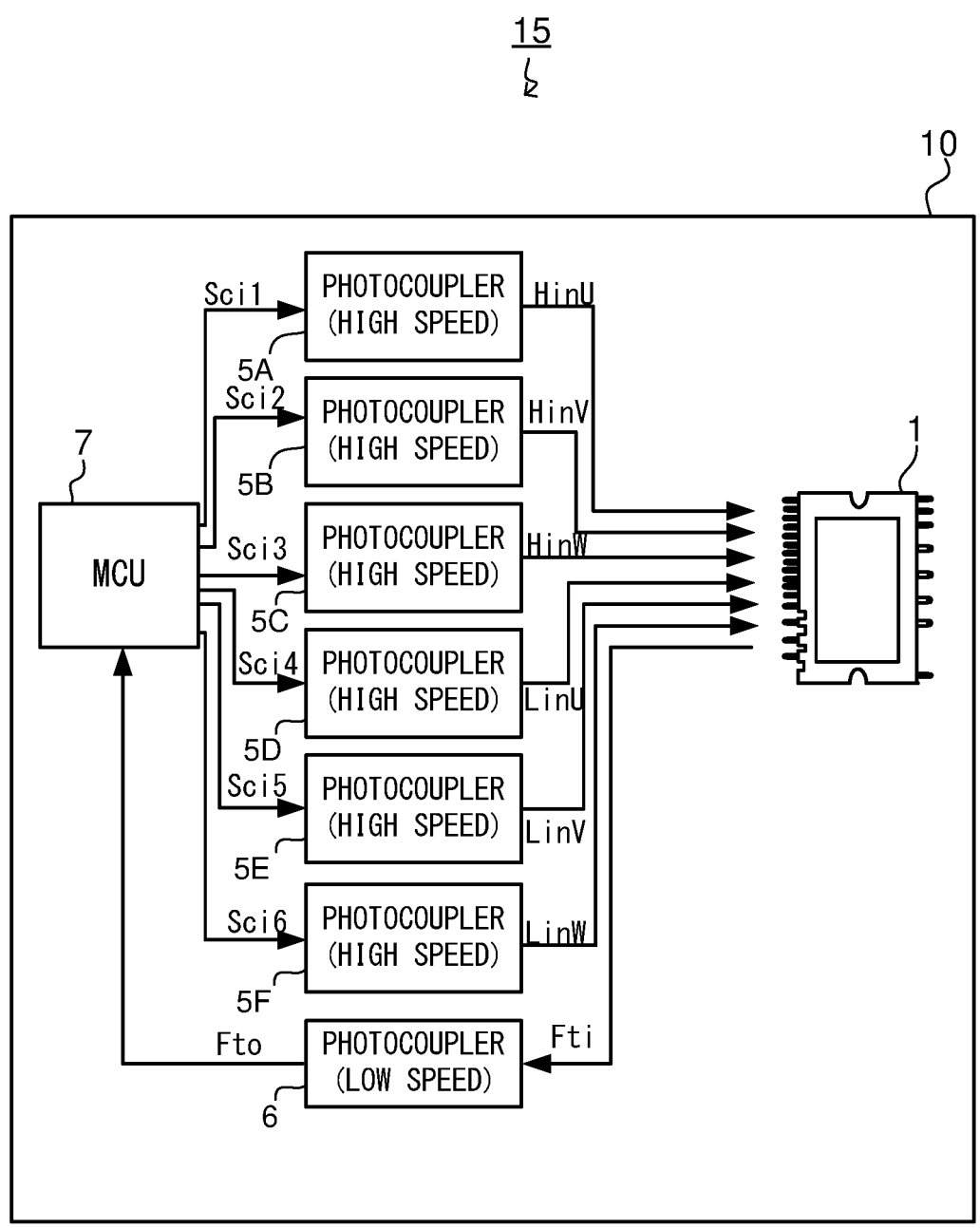
FIG. 1 is a diagram showing a configuration of an IPM system according to a first embodiment.

FIG. 1 is a diagram showing a configuration of an IPM system 15 according to a first embodiment. The IPM system 15 shown in FIG. 1 includes an MCU (microcontroller unit; microprocessor) 7, photocouplers 5A to 5F, a photocoupler 6, an IPM 1, and a printed circuit board (PCB) 10.

The MCU 7, the photocouplers 5A to 5F, the photocoupler 6, and the IPM 1 are mounted on the printed board 10 by, for example, soldering.

The MCU 7 transmits driving control signals Sci1 to Sci6 to the photocouplers 5A to 5F respectively which have comparatively high response speeds. The photocouplers 5A to 5F transmit the driving control signals Sci1 to Sci6 fed to them, while electrically isolating them, toward the IPM 1 as driving control signals HinU, HinV, HinW, LinU, LinV and LinW.

The IPM 1 functions as a motor driver that drives a three-phase DC brushless motor (unillustrated) and has three switching arms (unillustrated) each composed of a high-side switching element and a low-side switching element connected in series. That is, the IPM 1 has six switching elements. In the IPM 1, based on the driving control signals HinU, HinV, HinW, LinU, LinV and LinW fed to it, a driver IC (unillustrated) drives the respective control terminals of the high-side and low-side switching elements. The IPM 1 thereby operates as an inverter. The configuration of the IPM 1 will be described in detail later.

From the IPM 1, a fault signal Fti is transmitted to the photocoupler 6, which has a comparatively slow response speed. The fault signal Fti is transmitted when a fault such as an undervoltage state or an overheated state occurs. The photocoupler 6 transmits the fault signal Fti fed to it, while electrically isolating it, toward the MCU 7 as a fault signal Fto. In this way, it is possible to notify the MCU 7 of a fault state.

<<Configuration of the IPM>>

Figure 2:
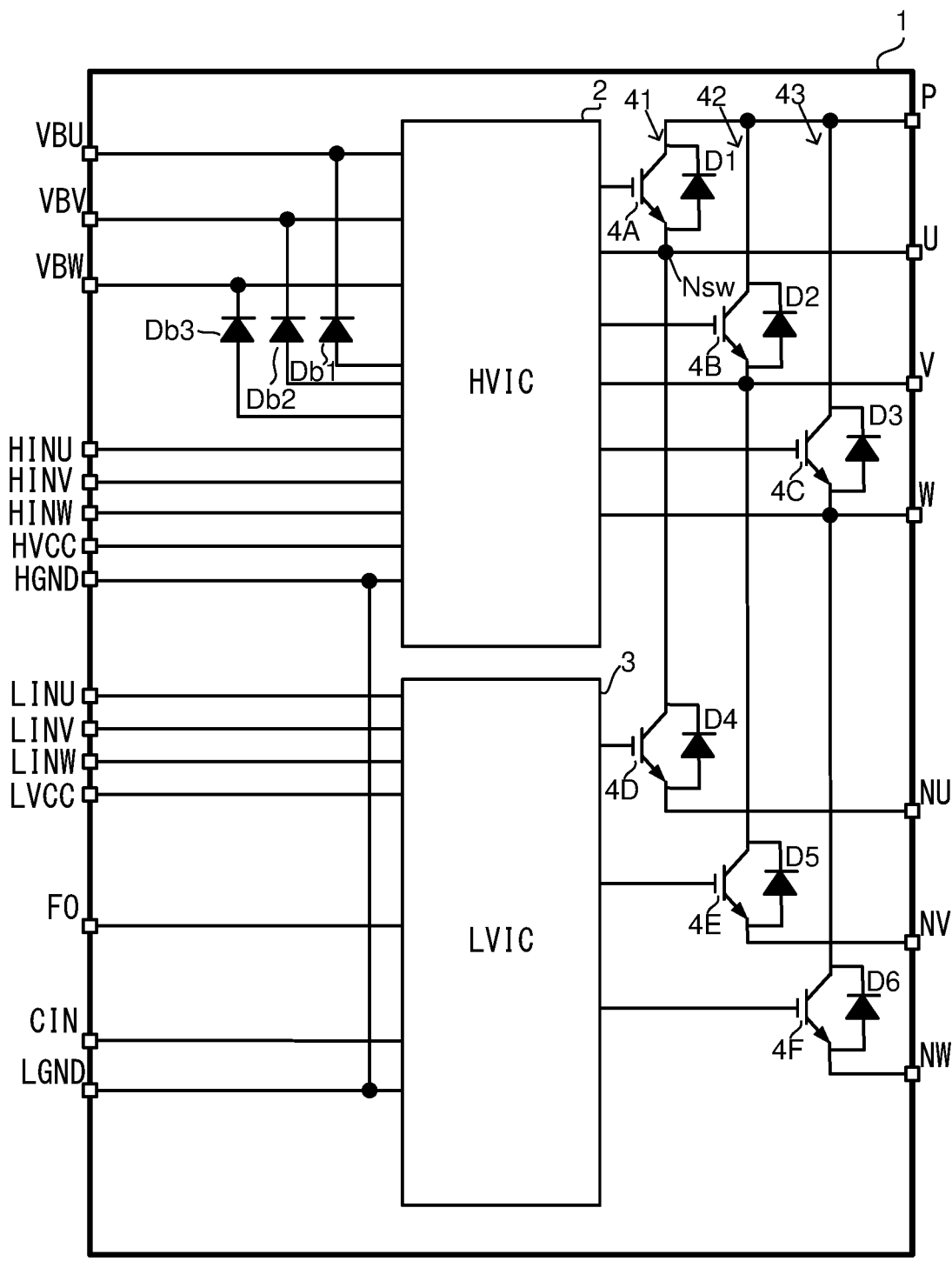
FIG. 2 is a diagram showing an internal configuration of the IPM according to the first embodiment.

FIG. 2 is a diagram showing an internal configuration of the IPM 1. As shown in FIG. 2, the IPM 1 is a semiconductor device (semiconductor package) having, sealed in a sealing material such as resin forming a package, a high-side driver IC2, a low-side driver IC3, a first high-side switching element 4A, a second high-side switching element 4B, a third high-side switching element 4C, a first low-side switching element 4D, a second low-side switching element 4E, a third low-side switching element 4F, antiparallel diodes D1 to D6, and boot diodes Db1 to Db3.

The IPM 1 has external terminals (lead terminals) for establishing electrical connection with the outside, including a VBU terminal, a VBV terminal, a VBW terminal, an HINU terminal, an HINV terminal, an HINW terminal, an HVCC terminal, an HGND terminal, an LINU terminal, an LINV terminal, a LINW terminal, a LVCC terminal, an FO terminal, a CIN terminal, an LGND terminal, a P terminal, a U terminal, a V terminal, a W terminal, an NU terminal, an NV terminal, and an NW terminal.

The first high-side switching element 4A, the second high-side switching element 4B, the third high-side switching element 4C, the first low-side switching element 4D, a second low-side switching element 4E, and a third low-side switching element 4F are each configured as, for example, an IGBT using an Si (silicon) substrate. These switching elements may be configured as, instead of IGBTs, MOSFETs using Si substrates, or by IGBTs or MOSFETs using SiC substrates or semiconductor substrates of what is called a wide band gap type.

The P terminal is fed with an input voltage Vin (see FIG. 3 described later) which is a high voltage. The input voltage Vin is, for example, 600 V. To the collector of the first high-side switching element 4A, the P terminal is connected. The emitter of the first high-side switching element 4A is connected to the collector of the first low-side switching element 4D. The emitter of the first low-side switching element 4D is connected to the NU terminal. In this way, the first high-side switching element 4A and the first low-side switching element 4D are connected in series to form a first switching arm 41.

To the collector of the second high-side switching element 4B, the P terminal is connected. The emitter of the second high-side switching element 4B is connected to the collector of the second low-side switching element 4E. The emitter of the second low-side switching element 4E is connected to the NV terminal. In this way, the second high-side switching element 4B and the second low-side switching element 4E are connected in series to form a second switching arm 42.

To the collector of the third high-side switching element 4C, the P terminal is connected. The emitter of the third high-side switching element 4C is connected to the collector of the third low-side switching element 4F. The emitter of the third low-side switching element 4F is connected to the NW terminal. In this way, the third high-side switching element 4C and the third low-side switching element 4F are connected in series to form a third switching arm 43.

The NU, NV, and NW terminals are connected to an application terminal for a ground potential via a common resistor Rs (see FIG. 3 referred to later).

In this way, the IPM 1 is configured to have six switching elements accommodated in one package. With the first high-side switching element 4A, the antiparallel diode D1 is connected. With the second high-side switching element 4B, the antiparallel diode D2 is connected. With the third high-side switching element 4C, the antiparallel diode D3 is connected. With the first low-side switching element 4D, the antiparallel diode D4 is connected. With the second low-side switching element 4E, the antiparallel diode D5 is connected. With the third low-side switching element 4F, the antiparallel diode D6 is connected. The switching elements are configured as IGBTs, and thus the antiparallel diodes D1 to D6 are configured as externally connected elements. When the switching elements are configured as MOSFETs, the antiparallel diodes D1 to D6 are configured as parasitic diodes (body diodes) incorporated in the respective switching elements.

The U terminal is connected to the node Nsw at which the first high-side switching element 4A and the first low-side switching element 4D are connected together. The U terminal is connected to the U-phase terminal of a motor M (see FIG. 3 referred to later), which is a three-phase DC brushless motor outside the IPM 1. The V terminal is connected to the node at which the second high-side switching element 4B and the second low-side switching element 4E are connected together. The V terminal is connected to the V-phase terminal of the motor M. The V terminal is connected to the node at which the third high-side switching element 4C and the third low-side switching element 4F are connected together. The W terminal is connected to the W-phase terminal of the motor M.

The high-side driver IC2 is electrically connected to the VBU, VBV, VBW, HINU, HINV, HINW, HVCC, and HGND terminals.

The VBU terminal is connected to one terminal of a boot capacitor (for U-phase) Cb1 (see FIG. 3 referred to later) outside the IPM 1. The VBU terminal is connected to the cathode of the boot diode Cb1. The anode of the boot diode Cb1 is electrically connected to the high-side driver IC2. The VBV terminal is connected to one terminal of a boot capacitor (for V-phase) (unillustrated) outside the IPM 1. The VBV terminal is connected to the cathode of the boot diode Db2. The anode of the boot diode Db2 is electrically connected to the high-side driver IC2. The VBW terminal is connected to one terminal of a boot capacitor (for W-phase) (unillustrated) outside the IPM 1. The VBW terminal is connected to the cathode of the boot diode Db3. The anode of the boot diode Db3 is electrically connected to the high-side driver IC2.

The HVCC terminal is a terminal through which a supply voltage Vcc is fed to the high-side driver IC2. The HINU, HINV, and HINW terminals are fed, from the external MCU 7 (see FIG. 1), with the driving control signals HinU, HinV, and HinW respectively. Based on the driving control signals HinU, HinV, and HinW, the high-side driver IC2 drives the respective gates (control terminals) of the first high-side switching element 4A, the second high-side switching element 4B, and the third high-side switching element 4C to turn on and off these high-side switching elements.

The HGND and LGND terminals are connected together inside the IPM 1.

The low-side driver IC3 is electrically connected to the LINU, LINV, LINW, LVCC, FO, CIN, and LGND terminals.

The LVCC terminal is a terminal through which the supply voltage Vcc is fed to the low-side driver IC3. The LINU, LINV, and LINW terminals are fed with, from the external MCU 7 (see FIG. 1), the driving control signals LinU, LinV, and LinW respectively. Based on the driving control signals LinU, LinV, and LinW, the low-side driver IC3 drives the respective gates (control terminals) of the first low-side switching element 4D, the second low-side switching element 4E, and the third low-side switching element 4F to turn on and off these low-side switching elements.

The FO terminal is a terminal through which the fault signal Fti (see FIG. 1) that is fed out from the low-side driver IC3 is fed toward the MCU 7. The CIN terminal is a terminal fed with a current sense signal Vis (see FIG. 3 referred to later) which is obtained by sensing a current passing through the low-side switching elements 4D to 4F.

In this way, the IPM 1 has a two-chip configuration having separate IC chips for the high-side driver IC2 that drives the high-side switching elements and the low-side driver IC3 that drives the low-side switching elements. The high-side driver IC2 is formed by, for example, an SOI (silicon-on-insulator) so as to withstand a high voltage.

Figure 3:
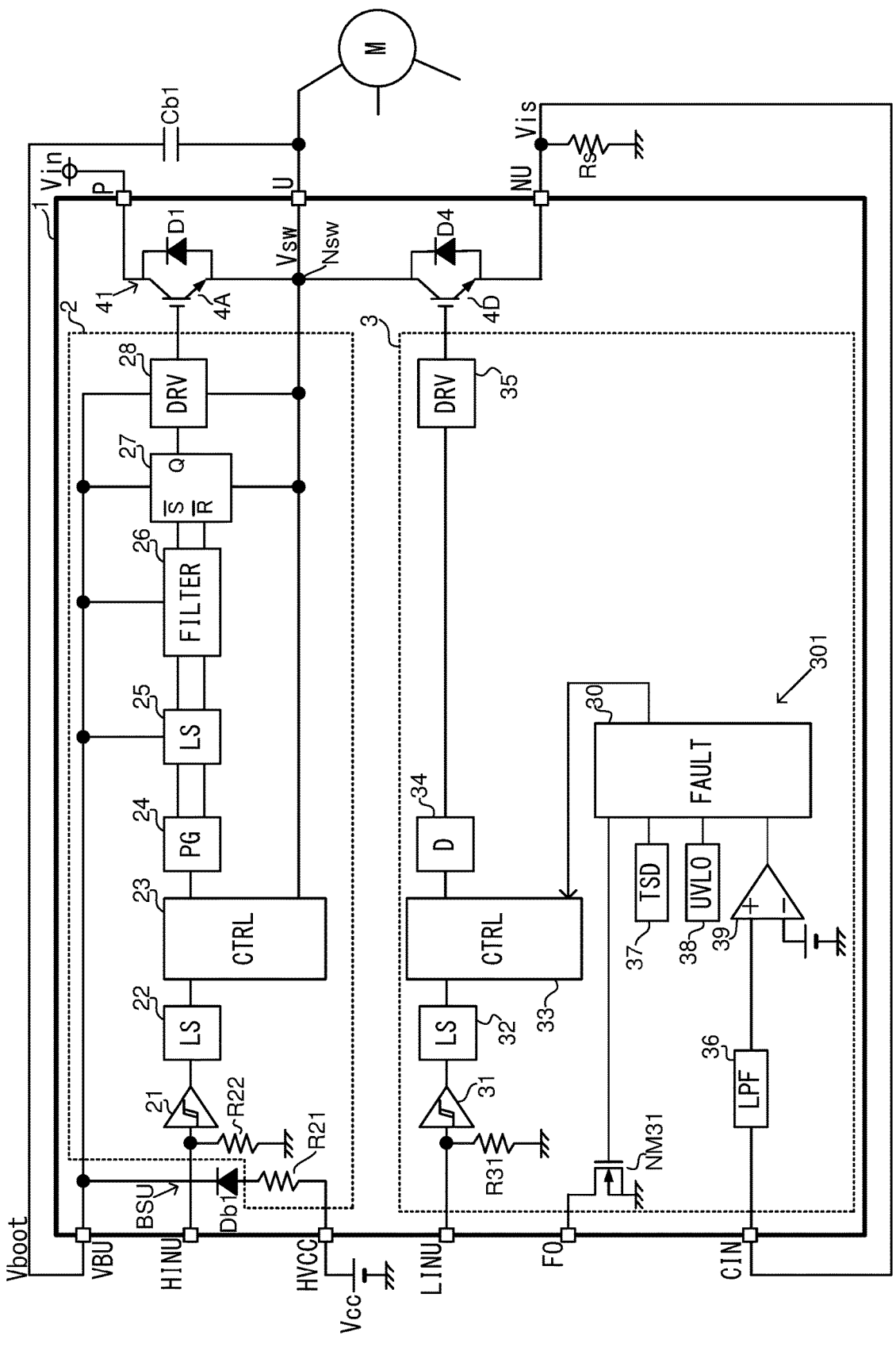
FIG. 3 is a diagram showing a circuit configuration for driving a switching arm in a high-side driver IC and a low-side driver IC included in the IPM according to the first embodiment.

FIG. 3 is a diagram showing one example of a circuit configuration for driving the switching arm 41 (the first high-side switching element 4A and the first low-side switching element 4D) in the high-side driver IC2 and the low-side driver IC3. The following description deals with the configuration for U-phase as a representative out of the three phases of the motor M.

As shown in FIG. 3, the high-side driver IC2 includes, in order from the input side (HINU terminal side) toward the output side (U terminal side), a resistor R22, a Schmitt trigger 21, a level shifter 22, a controller 23, a pulse generator 24, a level shifter 25, a filter 26, an RS flip-flop 27, and a driver 28.

The resistor R22 pulls down the HINU terminal to the application terminal for the ground potential. Thus, when the HINU terminal is open, the driving control signal HinU that is fed from the MCU 7 to the HINU terminal is at low level (the logic level that keeps off the first high-side switching element 4A), and this prevents the first high-side switching element 4A from being turned on unintendedly.

The Schmitt trigger 21 transmits the driving control signal HinU that is fed to the HINU terminal to the level shifter 22. The threshold voltage of the Schmitt trigger 21 is given prescribed hysteresis. With this configuration, it is possible to improve resistance to noise.

The level shifter 22 shifts the level of the output signal of the Schmitt trigger 21 to a voltage level that is suitable for input to the controller 23, and outputs the result. Based on a fault signal that is fed from the fault protector 301, the controller 23 controls whether or not to transmit the output signal of the level shifter 22 to the pulse generator 24 (and hence whether or not to drive the first high-side switching element 4A).

Based on the output signal of the controller 23, the pulse generator 24 generates pulse signals as an on-signal Son and an off-signal Soff. More specifically, the pulse generator 24 is triggered by a rising edge in the output signal of the controller 23 to keep the on-signal Son at high level for a predetermined on-period Ton1, and is triggered by a falling edge in the output signal of the controller 23 to keep the off-signal Soff at high level for a predetermined on-period Ton2. The on-periods Ton1 and Ton2 are determined such that the on-signal Son and the off-signal Soff are not at high level at the same time. That is, while the IPM 1 is operating normally, when one of the on-signal Son and the off-signal Soff is at high level, the other is at low level.

The level shifter 25 is a circuit which, between a high-potential block including the filter 26, the RS flip-flop 27, and the driver 28 and a low-potential block including the pulse generator 24, shifts the levels of signals to transmit them from the low-potential block to the high-potential block. More specifically, the level shifter 25 is fed with, from the pulse generator 24 in the low-potential block, the pulse signals as the on-signal Son and the off-signal Soff. The level shifter 25 shifts the level of these signals to feed them to the filter 26 as a first shifted signal and a second shifted signal. The high-potential block operates between a boot voltage Vboot that is fed to the VBU terminal and a switching voltage Vsw that is fed to the U terminal.

The filter 26 is a circuit which filters the first and second shifted signals that are fed from the level shifter 25 to feed the results to the RS flip-flop 27.

The RS flip-flop 27 has a set terminal (S terminal) to which the first shifted signal that has been filtered by the filter 26 is fed as a set signal S set, a reset terminal (R terminal) to which the second shifted signal that has been filtered by the filter 26 is fed as a reset signal Sreset, and an output terminal (Q terminal) from which an output signal Sq is output. The RS flip-flop is triggered by a falling edge in the set signal S set to set the output signal Sq to high level, and is triggered by a falling edge in the reset signal Sreset to set the output signal Sq to low level.

The driver 28 generates a high-side output signal HOU, which is a signal in accordance with the output signal of the RS flip-flop 27, and feeds it to the gate of the first high-side switching element 4A. The high level of the high-side output signal HOU equals the boot voltage Vboot, and the low level of the same signal equals the switching voltage Vsw.

The high-side driver IC2 includes a resistor R21. A bootstrap circuit BSU includes the resistor R21, the boot diode Db1 of which the anode is connected to the HVCC terminal via the resistor R21, and the boot capacitor Cb1 provided between the VBU terminal, which is connected to the cathode of the boot diode Cb1, and the U terminal. That is, one terminal of the boot capacitor Cb1 is connected to the VBU terminal and the other terminal is connected to the U terminal.

The bootstrap circuit BSU generates at the VBU terminal the boot voltage Vboot (a driving voltage for the high-potential block including the driver 28 etc.). The resistor R21 limits the current that is fed to the diode Db1 from the supply voltage Vcc via the HVCC terminal. Thus, the charge current for the boot capacitor Cb1 is limited.

Circuit configurations for driving the second high-side switching element 4B (V phase) and the third high-side switching element 4C (W phase) respectively are, like the configuration between the resistor R22 and the driver 28 described above, formed in the high-side driver IC2. Also for V and W phases respectively, bootstrap circuits similar to the bootstrap circuit BSU are formed.

The low-side driver IC3 includes, in order from the input side (LINU terminal side) toward the output side (U terminal side), a resistor R31, a Schmitt trigger 31, a level shifter 32, a controller 33, a delay circuit 34, and a driver 35.

The resistor R31 pulls down the LINU terminal to the application terminal for the ground potential. Thus, when the LINU terminal is open, the driving control signal LinU that is fed from the MCU 7 is at low level (the logic level that keeps off the first low-side switching element 4D), and this prevents the first low-side switching element 4D from being turned on unintendedly.

The Schmitt trigger 31 transmits the driving control signal LinU that is fed to the LINU terminal to the level shifter 32. The threshold voltage of the Schmitt trigger 31 is given prescribed hysteresis. With this configuration, it is possible to improve resistance to noise.

The level shifter 32 shifts the level of the output signal of the Schmitt trigger 31 to a voltage level that is suitable for input to the controller 33, and outputs the result.

Based on a fault signal that is fed from the fault protector 301, the controller 33 controls whether or not to transmit the output signal of the level shifter 32 to the delay circuit 34 (and hence whether or not to drive the first low-side switching element 4D).

The delay circuit 34 gives the output signal of the controller 33 a predetermined delay (corresponding to the circuit delay in the pulse generator 24, the level shifter 25, the filter 26, and the RS flip-flop 27 in the high-side driver IC2) and transmits the result to the driver 35.

The driver 35, based on the output signal from the controller 33 which is delayed by the delay circuit 34, outputs the low-side output signal LOU to the gate of the first low-side switching element 4D. The high level of the low-side output signal LOU equals the supply voltage Vcc, and the low level of the same signal equals the ground potential.

The fault protector 301 includes a fault signal generation circuit 30, a low-pass filter 36, a temperature protection circuit (TSD [thermal shutdown] circuit 37), an undervoltage-lockout circuit (ULVO circuit) 38, and an overcurrent protection circuit 39.

The TSD circuit 37, when the junction temperature of the IMP (semiconductor device) 1 becomes higher than a predetermined threshold value, switches the logic level of a temperature protection signal from one indicating a normal state (for example, low level) to one indicating a fault (for example, high level).

The UVLO circuit 38, when the supply voltage Vcc becomes lower than a predetermined threshold value, switches the logic level of a malfunction protection signal from one indicating a normal state (for example, low level) to one indicating a fault (for example, high level).

The CIN terminal is connected to the node at which the NU terminal and one terminal of the resistor Rs are connected together. A low-pass filter 36 is electrically connected to the CIN terminal. The low-pass filter 36 feeds the current sense signal Vis that appears at the CIN terminal to the overcurrent protection circuit 39. The overcurrent protection circuit 39 is composed of a comparator. The non-inverting input terminal (+) of the comparator is fed with the output of the low-pass filter 36, and the inverting terminal (−) of the comparator is fed with a reference voltage. The overcurrent protection circuit 39, when the current sense signal Vis becomes higher than a predetermined threshold value, switches the logic level of an overcurrent protection signal from one indicating a normal state (for example, low level) to one indicating a fault (for example, high level).

The fault signal generation circuit 30 monitors the temperature protection signal fed from the TSD circuit 37, the malfunction protection signal fed from the UVLO circuit 38, and the overcurrent protection signal fed from the overcurrent protection circuit 39. The fault signal generation circuit 30, when at least one of the temperature protection signal, the malfunction protection signal, and the overcurrent protection signal indicates a fault, switches the logic level of the fault signal from one indicating a normal state (for example, low level) to one indicating a fault (for example, high level). The fault signal generation circuit 30 feeds a fault signal to the controller 33.

The controller 33, when fed with a fault signal indicating a fault, turns off the first low-side switching element 4D. An NMOS transistor NM31 forms an open-drain output stage for outputting the fault signal Fti from the FO terminal. When there is no fault, the NMOS transistor NM31 is kept off by the fault signal generation circuit 30, and the fault signal Fti is kept at high level. On the other hand, when there is a fault, the NMOS transistor NM31 is kept on by the fault signal generation circuit 30, and the fault signal Fti is kept at low level.

Circuit configurations for driving the second low-side switching element 4E (V phase) and the third low-side switching element 4F (W phase) respectively are, like the configuration between the resistor R31 and the driver 35 described above, formed in the low-side driver IC3.

<<Simultaneous-on Prevention Control>>

The high-side driver IC2 in the IPM 1 so configured has a control function of preventing the high-side and low-side switching elements from being on simultaneously, and this will now be described. Here, the function of preventing the first high-side switching element 4A and the first low-side switching element 4D in the configuration shown in FIG. 3 from being on simultaneously will be described as a representative.

In the configuration of the high-side driver IC2 shown in FIG. 3, the controller 23 is electrically connected to the node Nsw. Thus, the controller 23 can monitor the switching voltage Vsw that appears at the node Nsw.

Figure 4:
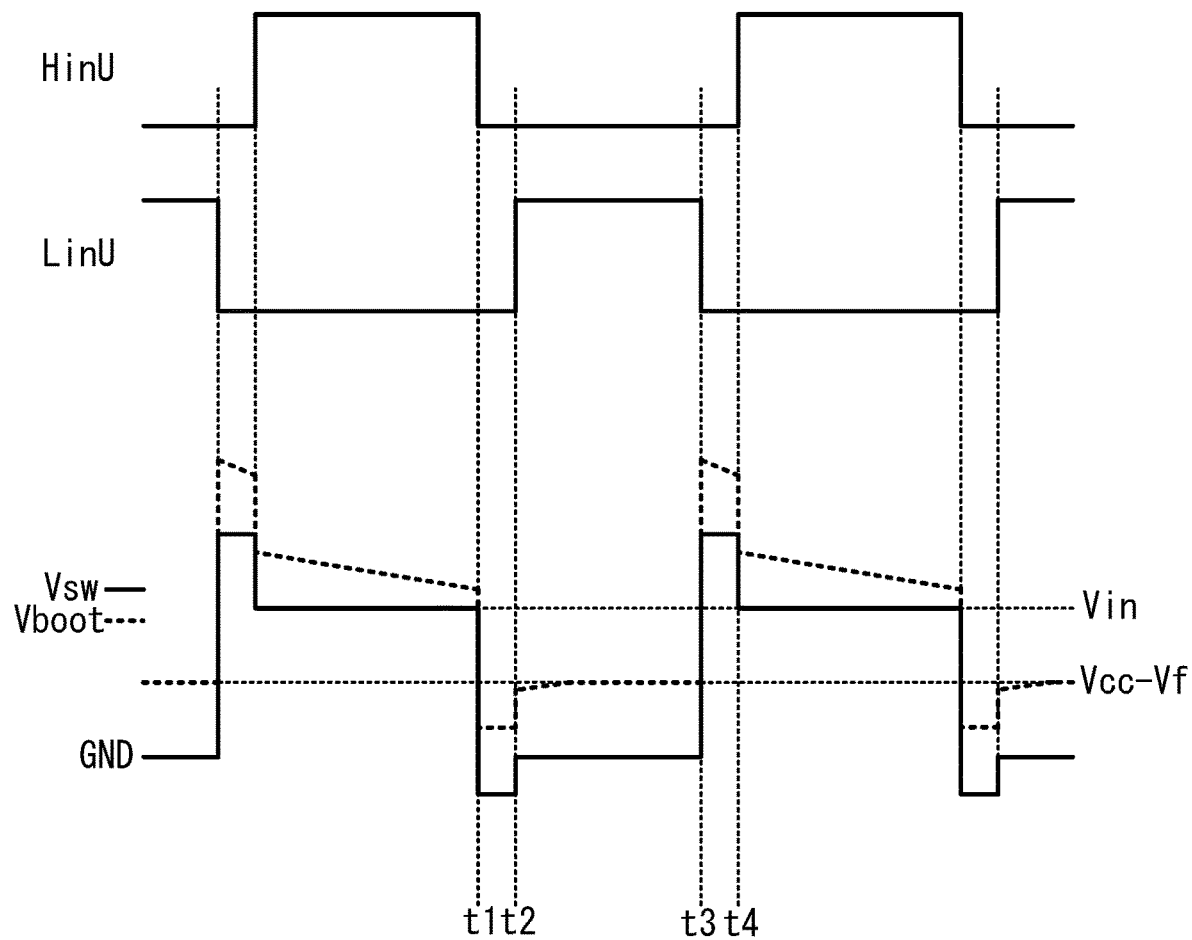
FIG. 4 is a timing chart showing one example of the waveforms of driving control signals HinU and LinU, a switching voltage Vsw (solid line), and a boot voltage Vboot (broken line)

FIG. 4 is a timing chart showing one example of the waveforms of the driving control signals HinU and LinU, the switching voltage Vsw (solid line), and the boot voltage Vboot (broken line). The waveforms in FIG. 4 are those observed in a case where the driving control signals HinU and LinU that are output from the MCU 7 are normal.

In FIG. 4, before time point t1, the driving control signal HinU is at high level and, according to the output signal from the controller 23, the first high-side switching element 4A is on. The driving control signal LinU is at low level and, according to the output signal from the controller 33, the first low-side switching element 4D is off. Thus, the switching voltage Vsw equals the input voltage Vin.

When, at time point t1, the driving control signal HinU turns from high level to low level, according to the output signal from the controller 23, the first high-side switching element 4A is turned off. As a result, a dead time starts, during which the first high-side switching element 4A and the first low-side switching element 4D are both off.

Here, the current that has been passing from the input voltage Vin via the first high-side switching element 4A and the U terminal through the inductor inside the motor M when the first high-side switching element 4A was on tends to keep passing, by the action of the inductor, via the antiparallel diode D4 connected to the first low-side switching element 4D through the U terminal. Thus, the switching voltage Vsw that appears at the U terminal is lower than the ground potential by Vf (the forward voltage) of the antiparallel diode D4.

Then, when, at time point t2, the driving control signal LinU is turned from low level to high level, according to the output signal from the controller 33, the first low-side switching element 4D is turned on. As a result, the dead time ends, and the switching voltage Vsw equals the ground potential.

Then, when, at time point t3, the driving control signal LinU is turned from high level to low level, according to the output signal from the controller 33, the first low-side switching element 4D is turned off and the dead time starts. Then, by the action of the inductor, the current keeps passing from the U terminal via the antiparallel diode D1 connected to the first high-side switching element 4A through the P terminal. As a result, the switching voltage Vsw is higher than the input voltage Vin by Vf of the antiparallel diode D1.

Then, when, at time point t4, the driving control signal HinU turns from low level to high level, the controller 23 first checks whether the switching voltage Vsw is higher than the input voltage Vin. In the case shown in FIG. 4, the switching voltage Vsw is higher than the input voltage Vin, and this indicates that the first low-side switching element 4D is off. Thus, the controller 23 outputs the output signal so as to turn on the first high-side switching element 4A. That is, the controller 23 confirms that the first low-side switching element 4D is off before it permits the first high-side switching element 4A to be turned on. Here, the switching voltage Vsw equals the input voltage Vin.

Figure 5:
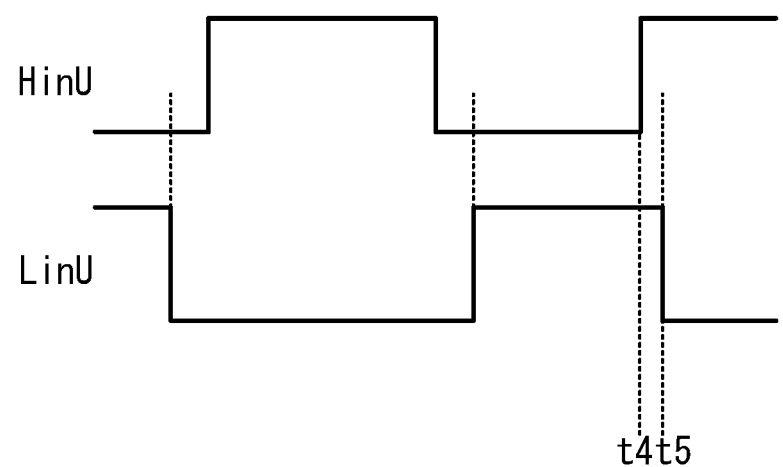
FIG. 5 is a timing chart showing one example of a case where a fault occurs in the driving control signals HinU and LinU.

On the other hand, FIG. 5 shows one example of a case where a fault occurs in the driving control signals HinU and LinU. More specifically, at time point t4, the driving control signal HinU is turned from low level to high level, but the driving control signal LinU has not yet been turned from high level to low level.

Even then, however, at time point t4, the controller 23 monitors the switching voltage Vsw to confirm that the switching voltage Vsw equals the ground potential and is not higher than the input voltage Vin. That is, being able to confirm that the first low-side switching element 4D is not off, the controller 23 does not permit the first high-side switching element 4A to be turned on but lets the first high-side switching element 4A be kept off. Then, the controller 23 continues to monitor the switching voltage Vsw. At time point t5, the driving control signal LinU is turned from high level to low level, and thus the first low-side switching element 4D is turned off. At this point, the controller 23 confirms that the switching voltage Vsw has become higher than the input voltage Vin, and thus it outputs the output signal for turning on the first high-side switching element 4A and permits the first high-side switching element 4A to be turned on.

In this way, as shown in FIG. 5, even when a fault occurs in the driving control signals that are output form the MCU 7, through the control by the high-side driver IC2, it is possible to prevent the first high-side switching element 4A and the first low-side switching element 4D from being on simultaneously. This embodiment inherently requires that the node Nsw, at which the first high-side switching element 4A and the first low-side switching element 4D are connected together, be electrically connected to the high-side driver IC2 together so as to provide a reference potential for the driver 28 etc., and the controller 23 can utilize this electrical connection to monitor the switching voltage Vsw.

Second Embodiment

Figure 6:
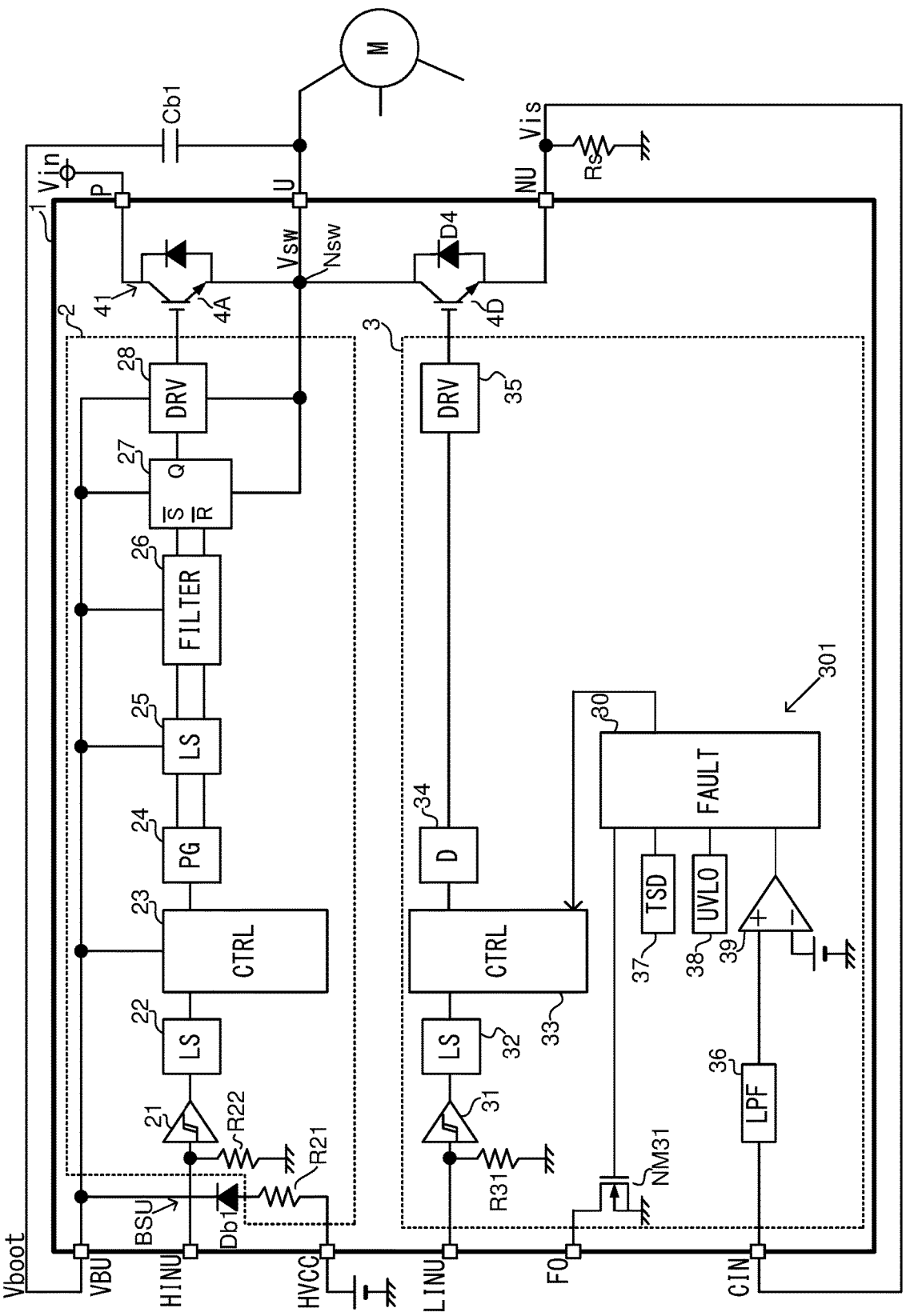
FIG. 6 is a diagram showing a configuration of the high-side driver IC and the low-side driver IC in an IPM according to a second embodiment.

FIG. 6 is a diagram showing a configuration of the high-side driver IC2 and the low-side driver IC3 in an IPM 1 according to a second embodiment. FIG. 6 is a diagram corresponding to FIG. 3 for the first embodiment described previously.

A difference of this embodiment from the first embodiment is that, as shown in FIG. 6, the controller 23 in the high-side driver IC2 monitors the boot voltage Vboot instead of the switching voltage Vsw. Thus, in this embodiment, the controller 23 is electrically connected to the VBU terminal.

In FIG. 4 referred to previously, the boot voltage Vboot is indicated by a broken line. Before time point t1, the first high-side switching element 4A is on and the first low-side switching element is off, and the boot voltage Vboot is higher than the input voltage Vin (=switching voltage Vsw) by the voltage ascribable to the electric charge stored in the boot capacitor Cb1.

Then, when, at time point t1, the first high-side switching element 4A is turned off, the switching voltage Vsw becomes lower than the ground potential, but the boot capacitor Cb1 is charged via the resistor R21 and the diode Db1 with the supply voltage Vcc, so that the boot voltage Vboot is clamped at a voltage higher than the ground potential. Thereafter, the boot capacitor Cb1 is charged, so that the boot voltage Vboot increases gradually.

Then, when, at time point t2, the first low-side switching element 4D is turned on, the switching voltage Vsw equals the ground potential, and the boot capacitor Cb1 is charged until the boot voltage Vboot equals the supply voltage Vcc minus Vf of the diode Db1.

Then, when, at time point t3, the first low-side switching element 4D is turned off, the switching voltage Vsw becomes higher than the input voltage Vin, and thus the boot voltage Vboot equals the switching voltage Vsw plus the supply voltage Vcc minus Vf of the diode Db1. Then, the boot capacitor Cb1 is discharged by an internal circuit, so that the boot voltage Vboot decreases gradually.

Then, when, at time point t4, the driving control signal HinU turns from low level to high level, the controller 23 monitors the boot voltage Vboot and checks whether the boot voltage Vboot is higher than the input voltage Vin. In the case shown in FIG. 4, the boot voltage Vboot is higher than the input voltage Vin, and thus the controller 23 outputs the output signal so as to turn on the first high-side switching element 4A. The first high-side switching element 4A is thus turned on. That is, the controller 23 confirms that the first low-side switching element 4D is off before it permits the first high-side switching element 4A to be turned on.

When, at time point t4, the first high-side switching element 4A is turned on, the switching voltage Vsw equals the input voltage Vin, and the boot voltage Vboot is higher than the input voltage Vin by the voltage ascribable to the electric charge stored in the boot capacitor Cb1. Then, the boot capacitor Cb1 is discharged by the internal circuit, so that the boot voltage Vboot decreases gradually.

In a case as at time point t4 shown in FIG. 5, the first low-side switching element 4D is on and the boot voltage Vboot is lower than the input voltage Vin, and thus the controller 23 does not permit the first high-side switching element 4A to be turned on until, at time point t5, it confirms that the first low-side switching element 4D is off and the boot voltage Vboot is higher than the input voltage Vin.

Thus, also in this embodiment, even when a fault occurs in the driving control signals that are output form the MCU 7 as shown in FIG. 5, through the control by the high-side driver IC2, it is possible to prevent the first high-side switching element 4A and the first low-side switching element 4D from being on simultaneously. Moreover, in this embodiment, the controller 23 can monitor the boot voltage Vboot by utilizing the boot voltage Vboot needed as the supply voltage for the driver 28, etc.

Third Embodiment

Figure 7:
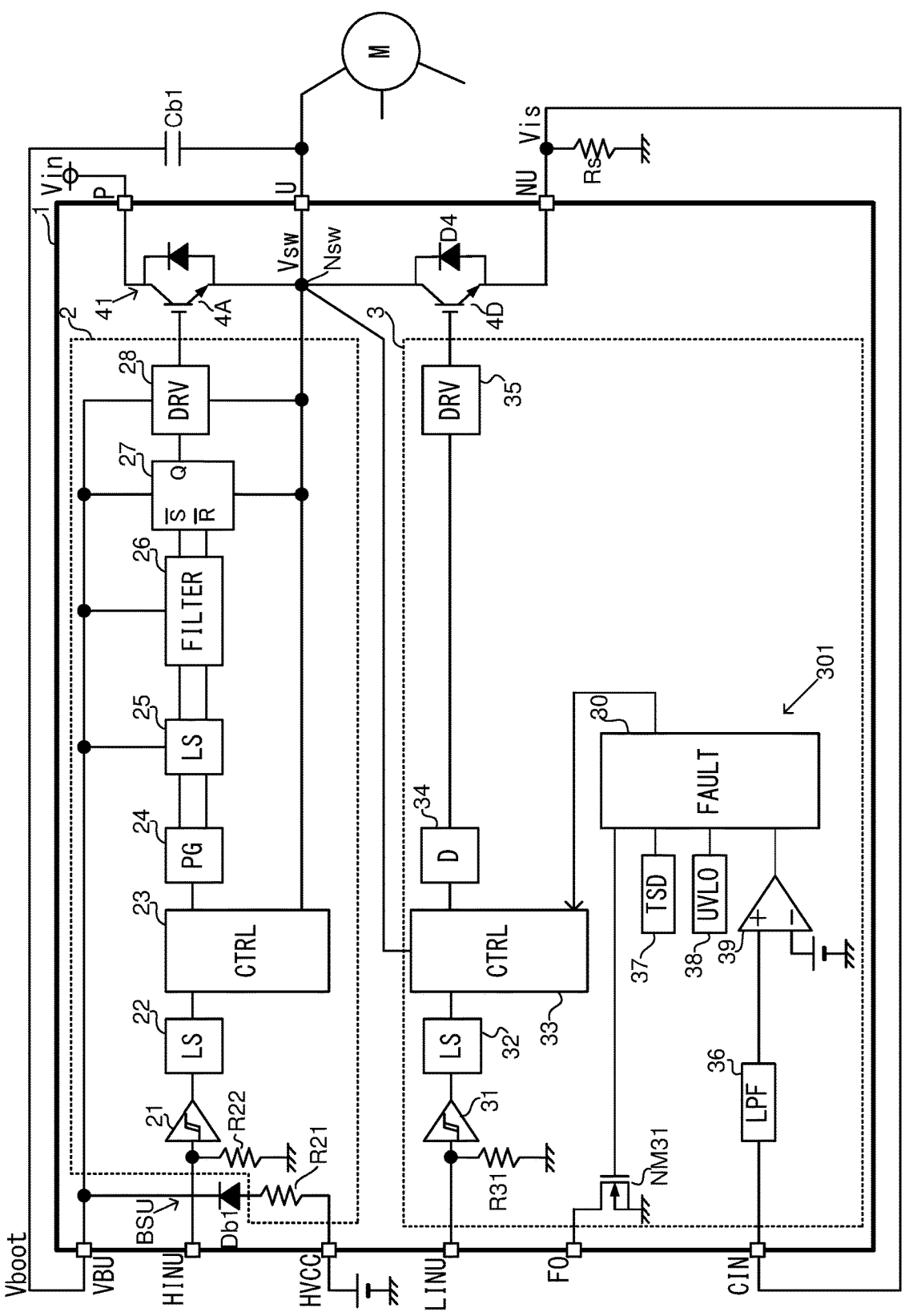
FIG. 7 is a diagram showing a configuration of the high-side driver IC and the low-side driver IC in an IPM according to a third embodiment.

FIG. 7 is a diagram showing a configuration of the high-side driver IC2 and the low-side driver IC3 in an IPM 1 according to a third embodiment. FIG. 7 is a diagram corresponding to FIG. 3 for the first embodiment described previously.

A difference of this embodiment from the first embodiment is that, as shown in FIG. 7, not only the controller 23 in the high-side driver IC2, but also the controller 33 in the low-side driver IC3 can monitor the switching voltage Vsw. Thus, in this embodiment, the node Nsw is electrically connected to the low-side driver IC3.

In this embodiment, as in the first embodiment, the controller 23 checks the switching voltage Vsw when the driving control signal HinU is switched from low level to high level, and, in addition, the controller 33 checks the switching voltage Vsw when the driving control signal LinU is switched from low level to high level.

In the case shown in FIG. 4, at time point t2 at which the driving control signal LinU turns from low level to high level, the controller 33 monitors the switching voltage Vsw to check whether the switching voltage Vsw is lower than the ground potential. Here, the switching voltage Vsw is lower than the ground potential, and thus the controller 33 outputs the output signal so as to turn on the first low-side switching element 4D. The first low-side switching element 4D is thus turned on. That is, the controller 33 confirms that the first high-side switching element 4A is off before it permits the first low-side switching element 4D to be turned on.

If, when the driving control signal LinU is switched from low level to high level, the first high-side switching element 4A is on and the switching voltage Vsw is not lower than the ground potential, the controller 33 does not permit the first low-side switching element 4D to be turned on until it confirms that the first high-side switching element 4A is turned off and the switching voltage Vsw is lower than the ground potential.

With this embodiment, it is possible to perform simultaneous-on prevention not only when the first high-side switching element 4A is turned on but also when the first low-side switching element 4D is turned on.

As a modified example of this embodiment, the controller 33 can monitor the boot voltage Vboot instead of the switching voltage Vsw. In this case, the controller 33 does not permit the first low-side switching element 4D to be turned on until it confirms that the first high-side switching element 4A is off and the boot voltage Vboot is lower than the input voltage Vin.

Or, as another modified example of this embodiment, the controller 23 can monitor the boot voltage Vboot instead of the switching voltage Vsw. Or, in this modified example, the controller 33 can monitor the boot voltage Vboot instead of the switching voltage Vsw.

Fourth Embodiment

Figure 8:
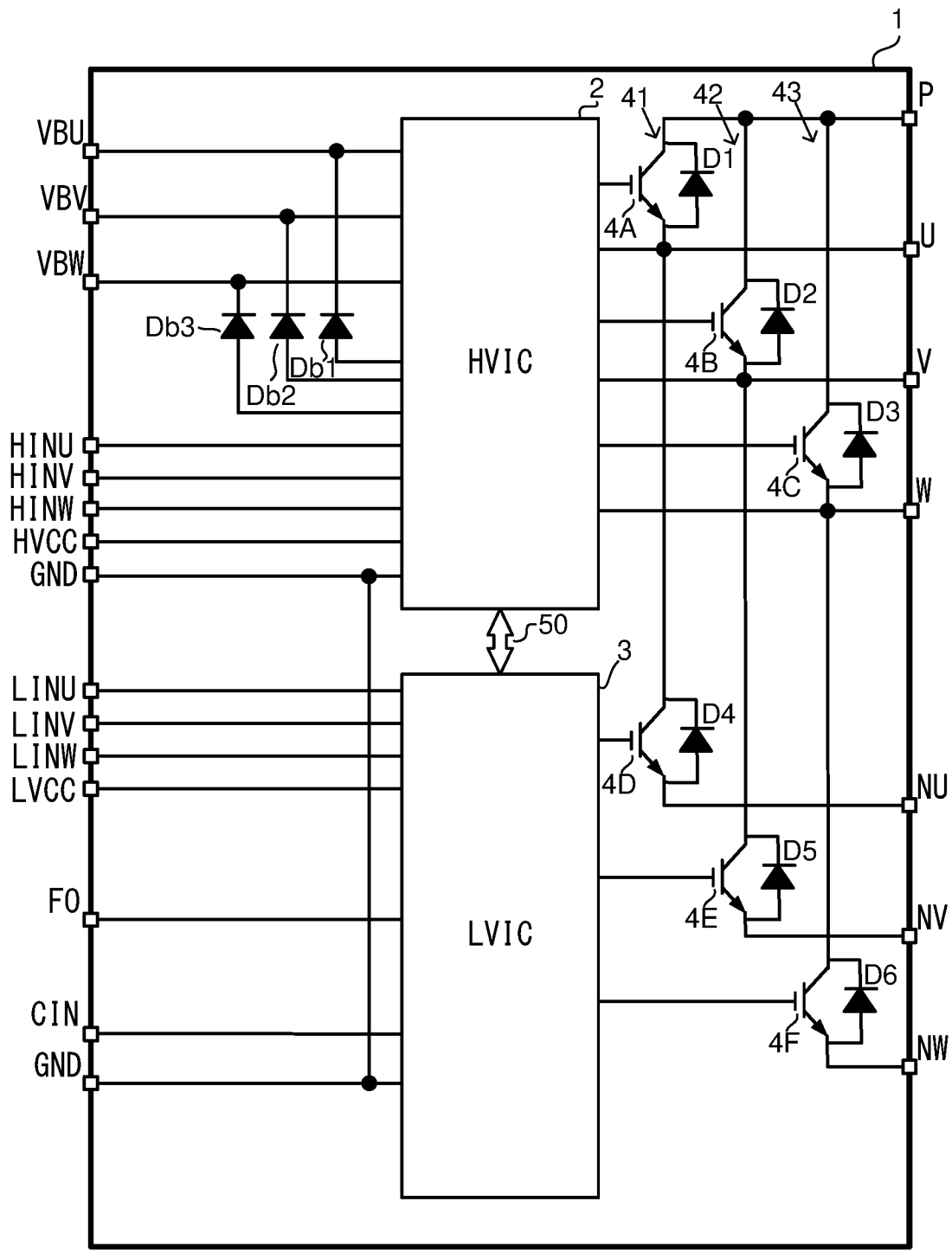
FIG. 8 is a diagram showing an internal configuration of an IPM according to a fourth embodiment.

Next, a fourth embodiment of the present invention will be described. FIG. 8 is a diagram showing an internal configuration of an IPM 1 according to a fourth embodiment. FIG. 8 is a diagram corresponding to FIG. 2 for the first embodiment.

A difference of this embodiment from the first embodiment is that, as shown in FIG. 8, communication 50 is possible between the chips of the high-side driver IC2 and the low-side driver IC3. Thus, in this embodiment, it is necessary to connect the high-side driver IC2 and the low-side driver IC3 together with a wire as a communication line.

Figure 9:
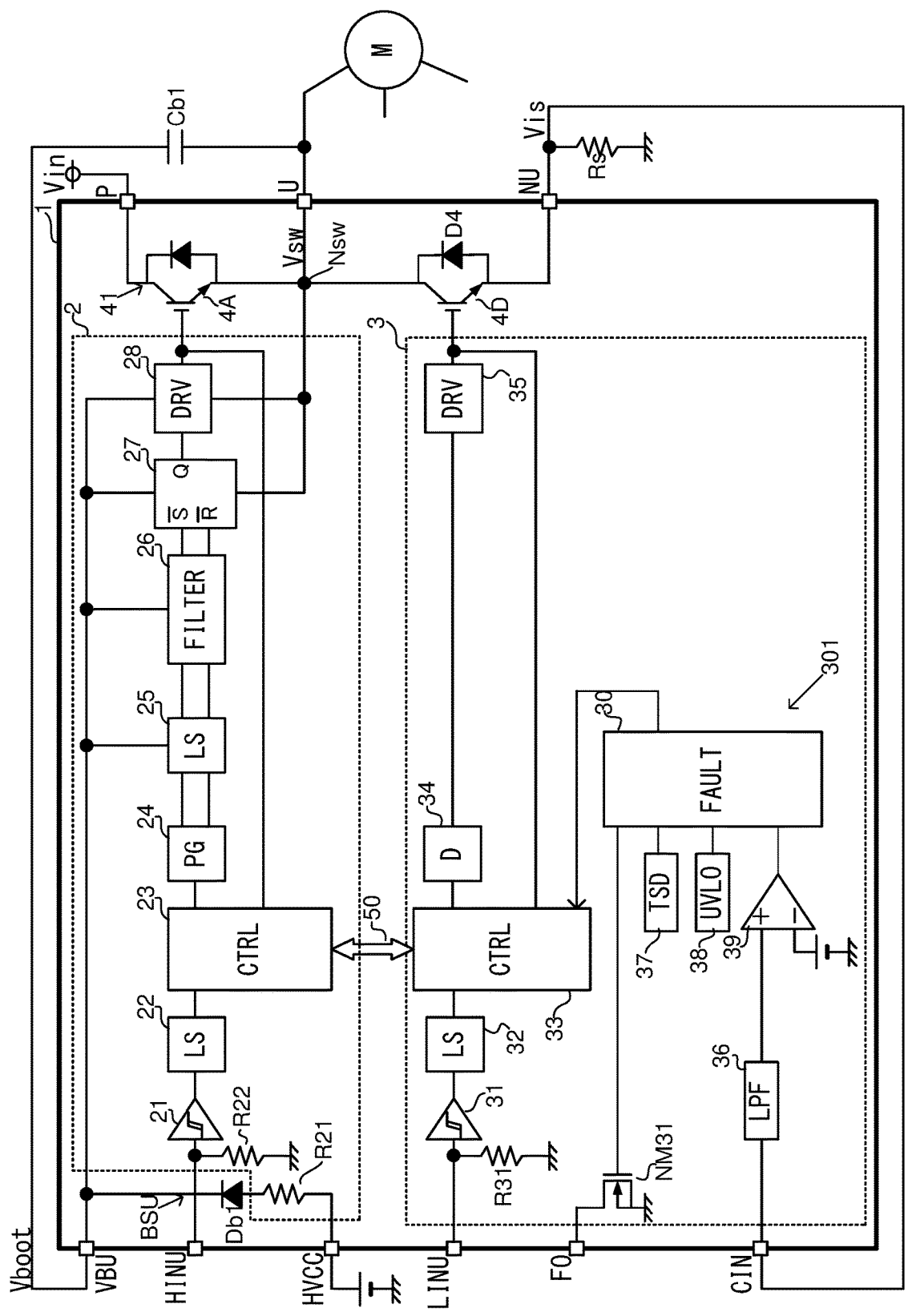
FIG. 9 is a diagram showing a configuration of the high-side driver IC and the low-side driver IC in the IPM according to the fourth embodiment.

FIG. 9 is a diagram showing a configuration of the high-side driver IC2 and the low-side driver IC3 in the IPM 1 according to the fourth embodiment. FIG. 9 is a diagram corresponding to FIG. 3 for the first embodiment.

As shown in FIG. 9, communication 50 is possible between the controller 23 in the high-side driver IC2 and the controller 33 in the low-side driver IC3. The controller 23 can monitor the high-side output signal HOU that is output from the driver 28 to be fed to the gate of the first high-side switching element 4A, and the controller 33 can monitor the low-side output signal LOU that is output from the driver 35 to be fed to the gate of the first low-side switching element 4D.

In this embodiment, when the driving control signal HinU is switched from low level to high level, the controller 23 makes the controller 33 check whether the first low-side switching element 4D is on or off through communication 50. The controller 33 checks the low-side output signal LOU and notifies the controller 23 whether the first low-side switching element 4D is on or off through communication 50. The controller 23 does not permit the first high-side switching element 4A to be turned on until it confirms that the first low-side switching element 4D is off.

On the other hand, when the driving control signal LinU is switched from low level to high level, the controller 33 makes the controller 23 check whether the first high-side switching element 4A is on or off through communication 50. The controller 23 checks the high-side output signal HOU and notifies the controller 33 whether the first high-side switching element 4A is on or off through communication 50. The controller 33 does not permit the first low-side switching element 4D to be turned on until it confirms that the first high-side switching element 4A is off.

Also with this embodiment, it is possible to prevent the first high-side switching element 4A and the first low-side switching element 4D from being on simultaneously. However, in this embodiment, it is necessary to connect the chips together with a wire for communication 50. This is not required in the first to third embodiments, and thus these embodiments are more advantageous in that regard.

Fifth Embodiment

Figure 10:
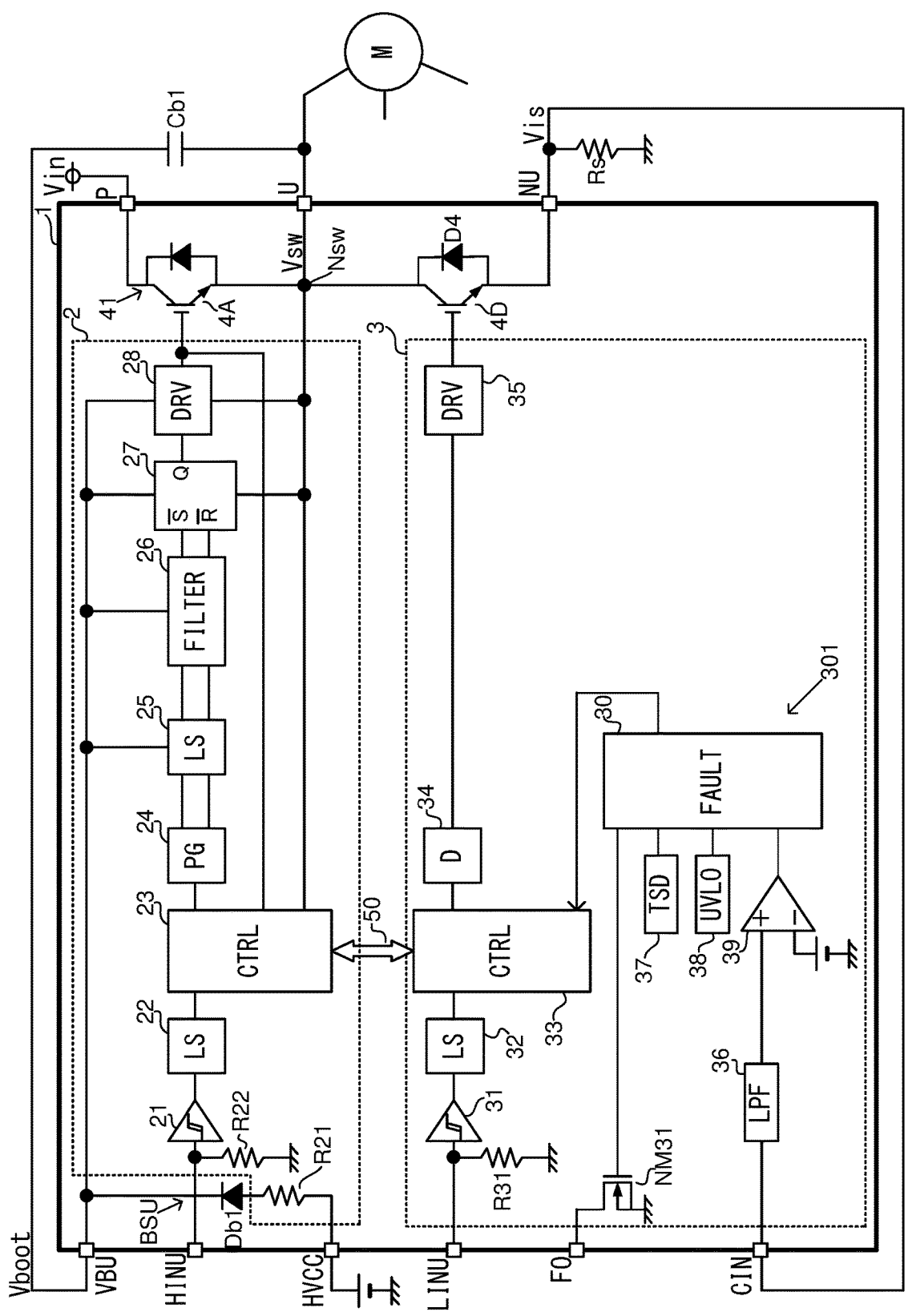
FIG. 10 is a diagram showing a configuration of the high-side driver IC and the low-side driver IC in an IPM according to a fifth embodiment.

FIG. 10 is a diagram showing a configuration of the high-side driver IC2 and the low-side driver IC3 in an IPM 1 according to a fifth embodiment. FIG. 10 is a diagram corresponding to FIG. 9 for the fourth embodiment.

In this embodiment, as in the fourth embodiment, communication 50 is possible between the controllers 23 and 33, and the controller 23 can monitor the high-side output signal HOU that is output from the driver 28. Furthermore, in this embodiment, as in the first embodiment, the controller 23 can monitor the switching voltage Vsw. It should be noted that the controller 33 does not monitor the low-side output signal LOU.

With this configuration, as in the first embodiment, when the driving control signal HinU turns from low level to high level, the controller 23 monitors the switching voltage Vsw and does not permit first high-side switching element 4A to be turned on until it confirms that the switching voltage Vsw is higher than the input voltage Vin.

On the other hand, as in the fourth embodiment, when the driving control signal LinU is switched from low level to high level, the controller 33 makes the controller 23 check whether the first high-side switching element 4A is on or off through communication 50. The controller 23 checks the high-side output signal HOU and notifies the controller 33 whether the first high-side switching element 4A is on or off through communication 50. The controller 33 does not permit the first low-side switching element 4D to be turned on until it confirms that the first high-side switching element 4A is off.

Also with this embodiment, it is possible to prevent the first high-side switching element 4A and the first low-side switching element 4D from being on simultaneously.

As a modified example of this embodiment, the controller 23 can, as in the second embodiment, monitor the boot voltage Vboot instead of the switching voltage Vsw.

<Others>

The above embodiments should be understood to be in every aspect illustrative and not restrictive. The technical scope of the present invention is defined not by the description of the embodiments given above but by the appended claims, and should be understood to encompass any modifications made in the sense and scope equivalent to those of the claims.

For example, although the IPM described above is configured to have six switching elements (three switching arms), this is not meant as any limitation; instead, the IMP may have four switching elements (two switching arms) when it is applied to, for example, an inverter that generates a two-phase alternating-current or a full-bridge DC-DC converter, or the IPM may have two switching element (one switching arm) when it is applied to a DC-DC converter, etc.

However, in a configuration where the IPM has six switching elements, if the driver IC is formed on one chip, the length of the wires that connect the driver IC and the switching element together may vary greatly among the switching elements. Thus, it is often preferable that the driver IC be formed on two chips, and this invention is particularly effective in such cases.

Figure 11:
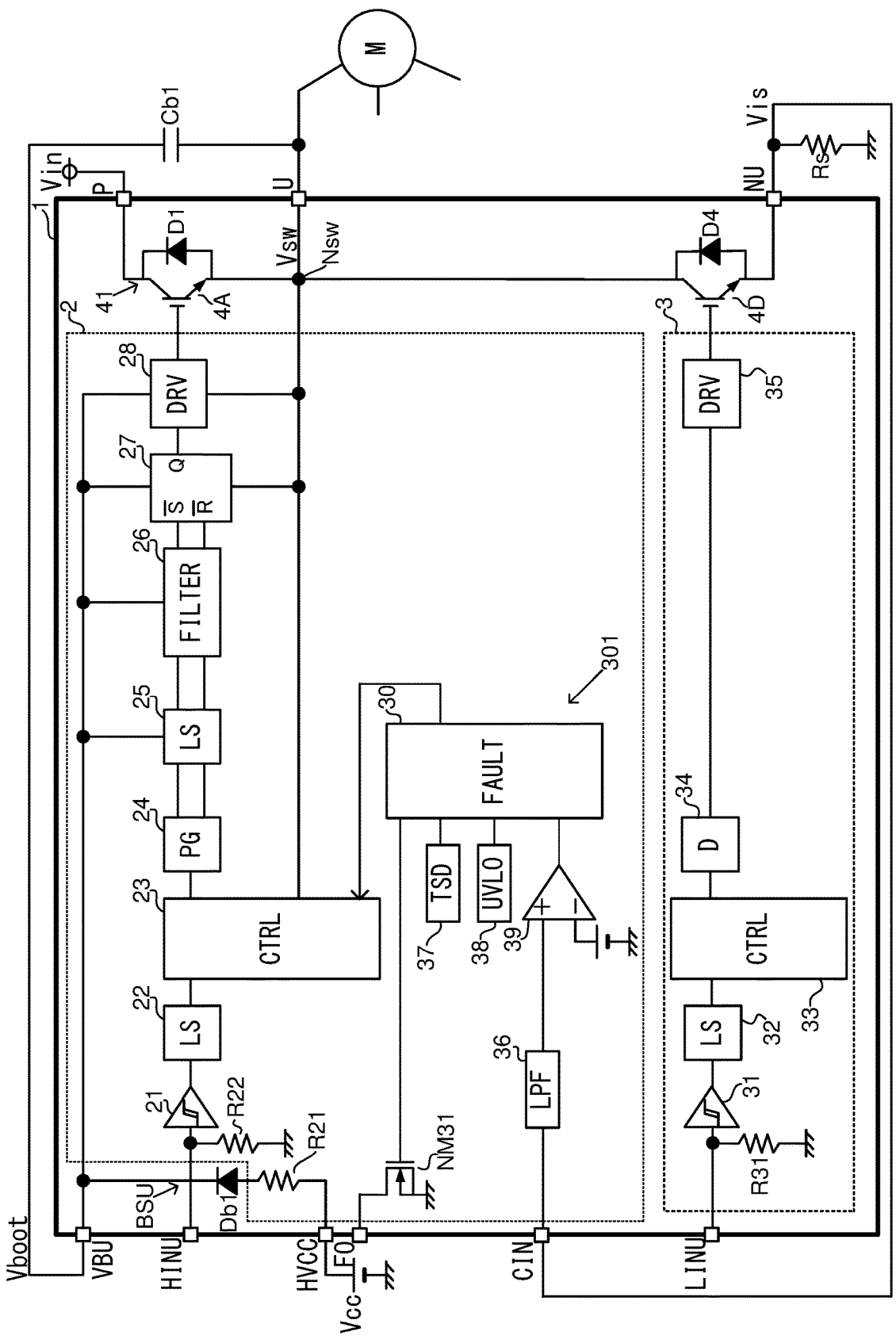
FIG. 11 is a configuration diagram showing a modified example of the IPM shown in FIG. 3.

It is also possible to modify the configuration (FIG. 3) of the first embodiment described above to have, for example, a configuration like the one shown in FIG. 11. In the configuration shown in FIG. 11, the fault protector 301 (the fault signal generation circuit 30, the low-pass filter 36, the TSD circuit 37, the UVLO circuit 38, and the overcurrent protection circuit 39) and the NMOS transistor NM31 shown in FIG. 3 are provided in the high-side driver IC2 instead of in the low-side driver IC3. Similar modifications can be applied not only to the first embodiment but also to any of the second to fifth embodiments described above.

INDUSTRIAL APPLICABILITY

The present invention finds applications, for example, as means for driving DC brushless motors.

LIST OF REFERENCE SIGNS

1 IPM
2 high-side driver IC
3 low-side driver IC
4A first high-side switching element
4B second high-side switching element
4C third high-side switching element
4D first low-side switching element
4E second low-side switching element
4F third low-side switching element
5A to 5F, 6 photocoupler
7 MCU
10 printed circuit board
15 IPM system
21 Schmitt trigger
22 level shifter
23 controller
24 pulse generator
25 level shifter
26 filter
27 RS flip-flop
28 driver
30 fault signal generation circuit
31 Schmitt trigger
32 level shifter
33 controller
34 delay circuit
35 driver
36 low-pass filter
37 TSD circuit
38 UVLO circuit
39 overcurrent protection circuit
301 fault protector
D1 to D6 antiparallel diode
Cb1 to Db3 boot diode
Cb1 boot capacitor
BSU bootstrap circuit
M motor
R21, R22, R31, Rs resistor
NM31 NMOS transistor

The invention claimed is:

1. A semiconductor device comprising:
a high-side switching element and a low-side switching element connected in series between an input voltage and a ground potential to form a switching arm;
a high-side driver IC configured to drive the high-side switching element; and
a low-side driver IC configured to drive the low-side switching element, the low-side driver IC being a chip separate from the high-side driver IC,
wherein
the high-side driver IC includes a first controller configured to monitor a switching voltage appearing at a node where the high-side and low-side switching elements are connected together, and
when a first driving control signal fed in from outside the semiconductor device instructs to turn on the high-side switching element, the first controller determines whether or not to permit the high-side switching element to be turned on based on a result of checking whether the switching voltage is higher than the input voltage.

2. The semiconductor device according to claim 1, comprising three switching arms including the switching arm, wherein
the high-side driver IC drives three high-side switching elements in the three switching arms, and
the low-side driver IC drives three low-side switching elements in the three switching arms.

3. The semiconductor device according to claim 1, wherein when the first driving control signal fed in from outside the semiconductor device instructs to turn on the high-side switching element, the first controller determines to permit the high-side switching element to be turned on when the switching voltage is higher than the input voltage, and the first controller determines not to permit the high-side switching element to be turned on when the switching voltage is not higher than the input voltage.

\* \* \* \* \*